United States Patent [19]

Jackson

[11] Patent Number: 5,269,850
[45] Date of Patent: Dec. 14, 1993

[54] METHOD OF REMOVING ORGANIC FLUX USING PEROXIDE COMPOSITION

[75] Inventor: David P. Jackson, Saugus, Calif.

[73] Assignee: Hughes Aircraft Company, Los Angeles, Calif.

[21] Appl. No.: 583,911

[22] Filed: Aug. 27, 1990

Related U.S. Application Data

[62] Division of Ser. No. 453,446, Dec. 20, 1989, abandoned.

[51] Int. Cl.$^5$ .......................... C23G 1/00; C23G 1/14
[52] U.S. Cl. ........................................... 134/2; 134/1; 134/26; 134/27; 134/29; 134/40
[58] Field of Search ...................... 134/1, 2, 26, 27, 34

[56] References Cited

U.S. PATENT DOCUMENTS

| | | | |
|---|---|---|---|
| 3,672,823 | 6/1972 | Boucher | 134/1 |
| 4,226,640 | 10/1980 | Bertholdt | 134/28 |
| 4,270,957 | 6/1981 | Donakowski et al. | 134/2 |
| 4,304,762 | 12/1981 | Leigh | 423/272 |
| 4,497,725 | 2/1985 | Smith et al. | 252/95 |
| 4,604,144 | 8/1986 | Wong | 134/28 |
| 4,612,142 | 9/1986 | Piorr et al. | 252/555 |
| 4,950,359 | 8/1990 | Parissi et al. | 134/2 |

FOREIGN PATENT DOCUMENTS

| | | |
|---|---|---|
| 0009839 | 4/1980 | European Pat. Off. . |
| 60-153982 | 8/1985 | Japan . |
| 63-20489 | 1/1988 | Japan . |
| WO8809368 | 12/1988 | PCT Int'l Appl. . |

*Primary Examiner*—Theodore Morris
*Assistant Examiner*—Saeed T. Chaudhry
*Attorney, Agent, or Firm*—Mary E. Lachman; M. W. Sales; W. K. Denson-Low

[57] ABSTRACT

A composition for removing organic contaminants, such a flux residues, from a solid substrate comprises: (a) hydrogen peroxide in the amount of about 3 to 5 percent by weight of the composition; (b) an alkaline compound in sufficient amount to provide a pH of at least 10.5 in the composition; (c) about 0.1 to 0.3 percent by weight of a chosen wetting agent which is unreactive with the hydrogen peroxide and the alkaline compound; and (d) purified water as the balance of the composition. Optionally, the composition may further comprise about 0.5 to 2.0 percent by weight of a chosen metal protective agent.

The solid substrate having organic contaminants thereon is exposed to the above noted composition whereby the organic contaminants are removed from the substrate and are converted into non toxic and non-hazardous products. Thus, negative environmental impact is avoided by the present process. In an alternative embodiment, the organic contaminant removal is further enhanced by exposing the composition and the organic contaminants on the substrate to ultraviolet radiation.

10 Claims, No Drawings

METHOD OF REMOVING ORGANIC FLUX USING PEROXIDE COMPOSITION

This is a division of application Ser. No. 07/453,446, filed Dec. 20, 1989 now abandoned.

BACKGROUND OF THE INVENTION

1. Field of the Invention

The present invention relates generally to a composition and method for removing organic contaminants from solid substrates. More particularly, the present invention relates to a hydrogen peroxide composition for removing organic contaminants such as solder flux; and to a method of using this composition.

2. Description of the Background Art

In the fabrication of printed circuit boards, integrated circuits, and various electronic components and devices, solder is used to join various component metal parts together. The solder itself comprises an alloy, such as of zinc and copper or of tin and lead. Prior to application of the solder to the metal surface, the surface is treated with a fluxing agent to remove oxides and other contaminants which might interfere with the metal bonding, and to prevent reformation thereof during the solder process. These fluxing agents are typically organic materials such as natural rosin extracted from pine tree sap, organic acids such as carboxylic acid, hydrazines, amines and amides, or inorganic materials such as inorganic acids or salts. The most commonly used fluxing agent is acid rosin flux. The term "rosin flux" is used herein to mean a flux material which comprises rosin, i.e., the resin after distilling turpentine from the exudation of species of pine, and containing abietic acid and its anhydride. Typically, a small amount of another acid is added to rosin flux to activate it and such compositions are referred to as "acid rosin flux" or "activated rosin flux." After the solder operation has been completed, excess flux as well as flux residues remain on the soldered surface, and these residues are resinous, waxy and conductive. These flux residues and excess flux must be removed prior to subsequent processing steps in order to prevent reaction thereof with the bonded part, leading to corrosion and resultant electrical insulation losses.

Defluxing solvents which are widely used at present are halogenated hydrocarbons such as 1,1,1-trichloroethane and Freon (a tradename of E. I. DuPont for polyhalogenated hydrocarbons including chlorine and fluorine). While these organic materials are effective defluxing solvents, they have the serious disadvantage that they have a negative impact on the environment due to air pollution and ozone depletion. In fact, recent environmental legislation mandates that these materials be banned or their production severely restricted in the next few years. When these materials are used, even in small quantities, expensive management systems for transport, storage, use, and disposal and environmental protection equipment must be used to prevent air and water discharges. In addition, waste solvents require energy intensive regeneration operations for these materials.

While numerous aqueous cleaners are available which are viable degreasing solvents, none of these has been found to be effective as an electronic component defluxing solvent. In addition, the resulting organic laden aqueous solvents require further processing before disposal.

Thus, an urgent need exists in the electronics industry for a solvent which effectively removes organic flux residues while at the same time avoiding any negative environmental impact. Such a solvent would also be desirable for removing other organic materials from other substrates.

SUMMARY OF THE INVENTION

The general purpose of the present invention is to provide a new and improved composition and method for removing organic contaminants from a chosen solid substrate while avoiding negative environmental impact. This composition and method possess the advantages of the above prior art processes while overcoming their significant disadvantages.

The above general purpose of this invention is accomplished by first providing a composition comprising: (a) hydrogen peroxide in the amount of about 3 to 5 percent by weight of said composition; (b) an alkaline compound in sufficient amount to provide a pH of at least 10.5 in said composition; (c) a chosen wetting agent in the amount of about 0.1 to 0.3 percent by weight of said composition, said wetting agent being unreactive with said hydrogen peroxide and said alkaline compound; and (d) purified water as the balance of said composition.

Optionally, the composition may further comprise a chosen metal protective agent in the amount of about 0.5 to 2.0 percent by weight of said composition, said metal protective agent being unreactive with said hydrogen peroxide and said alkaline compound.

The solid substrate having organic contaminants thereon is exposed to the above noted composition whereby the organic contaminants are removed from the substrate and are converted into non-toxic and non hazardous products. Thus, negative environmental impact is avoided by the present process. In an alternative embodiment of the present invention, the organic contaminant removal is further enhanced by exposing the composition and the organic contaminants on the substrate to ultraviolet radiation.

DESCRIPTION OF THE PREFERRED EMBODIMENTS

The composition of the present invention is effective for removing organic contaminants from a solid substrate while at the same time avoiding undesirable impact on the environment. The composition of the present invention is especially useful for removing flux residues which contaminate surfaces after a soldering operation. These flux residues typically comprise resinous, waxy contaminants which are the breakdown products from the soldering operation. The substrates which are soldered comprise, for example, printed wiring boards, integrated circuits, electronic components, electronic devices, electronic connectors, or electronic cables. In accordance with the present invention, the by-products, such as carbon dioxide, nitrogen, and water, which are formed are non-hazardous and can be removed without having a negative environmental impact.

The composition in accordance with the present invention comprises: (a) hydrogen peroxide ($H_2O_2$) in the amount of about 3 to 5 percent by weight; (b) an alkaline compound in a sufficient amount to provide a pH of 10.5 or higher in the composition; (c) a chosen wetting agent which is unreactive with hydrogen peroxide and the alkaline compound and which is present in the amount of about 0.1 to 0.3 percent by weight of the composition; and (d) purified water as the balance of the composition. Optionally, if the substrate comprises metal, a metal-protective agent is added to protect the metal surface from attack by the peroxide and alkali. The metal protective agent is unreactive with the hydrogen peroxide and the alkaline compound and is present in the amount of about 0.5 to 2.0 percent by weight of the composition.

The hydrogen peroxide acts as a solvent, emulsifier, and oxidant. While not limiting the present invention to a particular theory of operation, it is believed that the hydrogen peroxide has the following effect. After being immersed in the present composition, a flux-contaminated substrate invokes selective adsorption of hydrogen peroxide into the flux film and rapid decomposition of the inorganic peroxide. The selective adsorption of hydrogen peroxide by the rosin based contaminant films is due to the ether like solubility chemistry of hydrogen peroxide. Following adsorption, hydrogen peroxide rapidly decomposes into water and oxygen gas. The oxygen emulsifies the resinous contaminant, increasing surface area and solvency. This adsorption and emulsification process is observed as spontaneous foaming on the contaminated surface. The scrubbing foam enhances the cleaning activity of the solvent, dramatically improving penetration of solvent into low-tolerance spacings. After the organic flux contaminants have been removed from the substrate, they are oxidized by the action of nascent or atomic oxygen which is formed by the spontaneous decomposition of hydrogen peroxide, and are decomposed into carbon dioxide, nitrogen, and water. This effect is evidenced by a change in color in the composition from amber when it contains dissolved flux, to clear. The contaminants may be dissolved or suspended material.

The effectiveness of the composition of the present invention is believed to be due to a synergistic relationship between pH, peroxide chemistry and the wetting agent. It was found that peroxide based formulations with pH's of 2 (acidic) and 7 (neutral) did not effectively remove contaminants. In these cases, the flux contaminants tended to gel and discolor on the substrate surfaces. Alkaline formulations having a pH of greater than 10.5 were considerably more effective at solubilizing the flux residues than acid or neutral solutions. (This is probably due to ionization of flux acids by basic solutions, forming primative soaps.) Thus, the alkaline compound is added to the present composition to provide a pH of at least 10.5, preferably within the range of 10.5 to 11.5. The alkaline compound may be, for example, sodium hydroxide or potassium hydroxide, with sodium hydroxide being most preferred. If sodium hydroxide is used, it is present in the amount of about 0.2 to 0.5 percent by weight of the composition.

The wetting agent must be chosen to be compatible with the other components in the present composition. Conventional wetting agents such as sodium alkylaryl sulfonate and other organic synthetic detergents decompose rapidly in the presence of strong alkaline oxidizing/ bleaching solutions such as the composition of the present invention. This results in rapid decomposition of the hydrogen peroxide solvent and excessive foaming in the solution. A preferred wetting agent for use in the present composition comprises sodium 2-ethylhexyl sulfate (obtained from Niacet Co., Niagara Falls, N.Y.). It has good solubility, stability, and penetrating action in near-boiling alkaline and acid solutions, and is one of the few anionic surfactants stable in concentrated bleaching solutions. Other suitable wetting agents for practising the present invention may comprise sodium metasilicate or short chain branched surfactants. The wetting agent is used in the present invention in the amount of about 0.1 to 0.3 percent by weight of the composition. If the substrate comprises a metal, such as in a printed wiring board, the metal surfaces must be protected from attack by the peroxide and alkali in the present composition. The particular metal protective agent used depends on the specific metal being protected. For example, calcium and phosphorous compounds are used as protective agents for copper. The selection of the particular protective agent for a particular metal is known in the art and will not be detailed here. Suitable metal protective agents for practising the present invention include sodium carbonate or sodium metasilicate. The metal protective agent is present in the amount of about 0.5 to 2.0 percent by weight of the composition.

The optimum operating temperature of the present composition to provide effective contaminant removal within a short period of time is within the range of 51.7 to 71.1° C. (125° to 160° F.). Within this range, flux contaminants may be removed in 1 to 3 minutes. A preferred temperature for use of the present composition is about 60° C. (140° F.). The increased temperature promotes the reaction, improves penetration of the composition by softening gummy contaminants, and keeps particulates in suspension so that they do not deposit on the cleaned substrates. In addition, the elevated temperature optimizes the effectiveness of the ultraviolet radiation for cleaving bonds in organic materials, as described below.

The contaminants which can be removed in accordance with the present invention comprise organic materials which include, but are not limited to the residues left by commonly used flux materials. These flux residues comprise oils, resins, and other organic materials. Since the present composition and method are effective for cleaving carbon to-carbon bonds, they may be used for the removal of other organic compounds as well. Such materials include, but are not limited to, oil, grease, lubricants, photoresist, adhesive residues, plasticizers, or dyes.

The solid substrate from which contaminants can be removed in accordance with the present invention may comprise any material which is not adversely affected by the peroxide or alkaline components of the present composition. Such materials include, but are not limited to, polyimide/polyamide laminates and epoxy/glass laminates which are used in printed wiring boards, silicon which is used in electronic devices, and anodized aluminum or polyimide which are used in cables and connectors. The solid substrate may have a simple or complex configuration and may include interstitial spaces which are difficult to clean by known methods. The substrate may be in the form of a continuous layer or in the form of discrete particles.

In accordance with an alternative embodiment of the present invention, ultraviolet radiation is used to enhance the cleaning process. When hydrogen peroxide is exposed to ultraviolet radiation having a wavelength within the range of 184 to 300 nanometers (nm), preferably about 253 nm, such as from a xenon flash lamp, the hydrogen peroxide is dissociated to form a hydroxyl radical ($OH^-$) which is very reactive. This hydroxyl radical then cleaves the carbon-to-carbon bonds in the organic contaminant material, forming carbon dioxide and water. In addition, the ultraviolet radiation itself also cleaves the carbon-to-carbon bonds in the organic contaminant materials, adding even further effectiveness to the cleaning process. The source of ultraviolet radiation, such as a xenon flash lamp or a mercury vapor lamp, is located external to the chamber containing the substrate to be cleaned and the present composition, and the radiation is directed into the cleaning chamber. For this purpose, a quartz window is provided on one surface of the cleaning chamber to permit transmission of the ultraviolet radiation. Optionally, a focusing barrel may be provided between the quartz window and the radiation source to improve the efficiency of the ultraviolet radiation transmission. Such methods for introducing radiation into reaction chambers are well known.

The composition of the present invention may be used in essentially the same manner as known defluxing agents are used, namely in a spray or soak operation. If used in a soak operation, it is desirable to keep the present composition agitated, by air or mechanical or ultrasonic means. As an added feature in the present method, after the substrate has been treated with the present composition, residual alkaline materials (alkali or alkali salts) remaining on the substrate are neutralized. A preferred neutralization agent comprises hot carbonated water, which is applied at 51.7° to 71.1° C. (125° to 160° F.). The carbonated water may be formed by bubbling carbon dioxide into deionized water. The use of the carbonated water rinse keeps the rinse water below a pH of 9.5, which is the regulated limit for disposal in a sewer. After the neutralization step, the substrate is rinsed in hot water at 51.7° to 71.1° C. (125° to 160° F.), preferably with air agitation, and then dried, preferably with hot air. In an exemplary batch processing technique, in which contaminated substrates are loaded into a chamber and treated, in turn, with the present composition, neutralizing agent, water, and hot air, the following approximate processing times may typically be used:

|   | Step | Time |
|---|------|------|
| a. | Exposure of contaminated substrate to present composition | 3 minutes |
| b. | Neutralization | 3 minutes |
| c. | Hot water rinse | 4 minutes |
| d. | Hot air drying | 5 minutes |

Thus, the present process can be completed within 15 minutes.

Alternatively, the present process may be practised as an "in line" process. The contaminated substrates are loaded into a rack and the rack is lowered in sequence into a series of chambers containing, respectively, the present composition, the neutralizing agent, and deionized water sprayers. As yet another alternative, this in line processing may be accomplished by a conveyorized system.

After the substrate has been treated with the present composition, the substrate is removed from the chamber containing the composition. The starting composition is then re established by the addition of hydrogen peroxide and, if necessary, the other components of the composition. Thus, the bulk cleaning solvent remains in place and does not require disposal. Rather, the composition is regenerated in situ by the addition of component materials as required.

As an added feature of the present invention, the present composition removes metallic oxides from the substrate and thus serves also as a solder brightener. This eliminates the need for a secondary process, such as treatment with fluoroboric acid.

Examples of practise of the present invention are as follows.

EXAMPLE 1

This example illustrates the use of the composition and method of the present invention to remove solder flux from printed wiring boards.

It should be noted that while the present composition is non toxic, general safety precautions, such as the use of goggles and protective clothing, are necessary.

The test samples comprised polyimide/polyamide laminate printed wiring boards containing copper metallization and having been exposed to Alpha 611, a solder flux obtained from Alpha Metals Company of Alpharetta, Ga., and comprising a mildly activated rosin flux. The composition of the present invention comprised: approximately 3.0 percent by weight hydrogen peroxide; approximately 0.2 percent by weight sodium hydroxide; approximately 0.1 percent by weight sodium 2-ethylhexyl sulfate as the wetting agent; approximately 0.5 percent by weight sodium metasilicate as the metal protective agent; and the balance being purified water. The temperature of the composition was maintained at 60° C. (140° F.). The samples were treated in a batch process as previously described herein using the previously described processing steps and times. The present composition was nearly transparent prior to introduction of flux-contaminated materials, with only trace amounts of gas liberation visible. When the contaminated material was introduced, vigorous gas formation on the flux residue was observed. This action continued as the flux was emulsified and dissolved into solution. Continued gas formation was visible as the dissolved flux residues continued to be oxidized. Completion of the decomposition was indicated by slow gas evolution and change in fluid color. Surface foaming was minimal. Complete removal of the flux residues was accomplished in an average of less than two minutes. The soldered joints were clean and free of oxides, i.e., bright in appearance.

By contrast, it was found that alkaline solutions alone did not effectively separate the bulk of the flux residues from the substrate. In addition, alkaline solutions with wetting agents, but without hydrogen peroxide, required in excess of 10 minutes to separate flux residues from the substrate. Even after separation, the flux residues did not disperse well.

EXAMPLE 2

This example illustrates the use of the composition and method of the present invention to remove solder flux from cable connectors.

A soft anodized aluminum connector was treated with the composition of the present invention as described in Example I except using a temperature of 160° F. (71° C.) and 60-second rinse times for both the neutralization and final rinse steps. There was no visually detectable degradation of the anodized aluminum by exposure to the present composition.

In another experiment, a cable made of Kapton (a trademark of E.I. du Pont de Nemours for a polyimide) was contaminated with Kester 197, a mildly activated rosin based flux obtained from Litton-Kester Company of Chicago, Ill. The Kapton cable was treated in accordance with the present invention as described above. Complete removal of the flux was accomplished as determined by visual inspection under 25X magnification.

EXAMPLE 3

This example illustrates the use of the embodiment of the method of the present invention in which ultraviolet radiation is used to enhance the contaminant removal.

The composition and method described in Example 1 are used except that the composition and the substrate containing contaminants are exposed to radiation from a xenon flash lamp as previously described herein. The cleaning process proceeds generally as described in Example 1, except that complete flux removal is accomplished more rapidly.

As previously discussed, the organic contaminants are oxidized by the present composition to form carbon dioxide, nitrogen, and water. The carbon dioxide and nitrogen are non-hazardous and may be exhausted into the atmosphere. The water by-product contains no noxious material and may be disposed of in a sewer without further treatment or may be re used. The hydrogen peroxide in the present composition is decomposed during the cleaning operation into atomic oxygen or hydroxyl radicals and water and the former react with the contaminants to form the above-noted products. Insoluble precipitates, such as cellulose gums, may also be formed as by products of the bond cleaving of the present composition, and may be readily removed by filtration. Thus, no toxic or hazardous materials are formed as a result of the present method. Consequently, the present process obviates the need for the expensive solvent emission control and waste management procedures required when using prior art halogenated solvents. In addition, environmental pollution and exposure of workers to hazardous materials are also avoided by the present composition and method.

While the previous discussion has focused on the use of the present composition and method to remove flux residues from solid substrates, it is not intended to limit the present invention to this particular contaminant. Rather, it is intended to include within the scope of the present invention the removal of any organic material from a given solid substrate.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for removing organic flux residue from a solid substrate while simultaneously avoiding negative environmental impact, said method comprising:
   (a) providing a composition comprising:
      (1) hydrogen peroxide in the amount of about 3 to 5 percent by weight of said composition;
      (2) an alkali metal hydroxide in sufficient amount to provide a pH of at least 10.5 in said composition;
      (3) a chosen wetting agent in the amount of about 0.1 to 0.3 percent by weight of said composition, said wetting agent being unreactive with said hydrogen peroxide and said alkali metal hydroxide; and
      (4) purified water as the balance of said composition; and
   (b) exposing said solid substrate having said organic flux residue thereon to said composition at a temperature within the range of 51.7° to 71.1° C. or 125° to 160° F., whereby said organic flux residue is removed from said substrate and converted into non-toxic and non-hazardous products.

2. The method of claim 1 further comprising after said exposing said substrate to said composition, neutralizing residual said alkali metal hydroxide therefor materials on said substrate, rinsing said substrate with water, and drying said substrate.

3. The method of claim 2 wherein said neutralizing comprises exposing said substances to hot carbonated water.

4. The method of claim 1 wherein said exposing in step "b" further comprises exposing said composition and said flux residue on said substrate to ultraviolet radiation having a wavelength within the range of 184 to 300 nanometers.

5. The method of claim 4 wherein said radiation has a wavelength of about 253 nanometers.

6. The method of claim 1 wherein said substrate comprises a metal and said composition further comprises a metal protective agent in the amount of about 0.5 to 2.0 percent by weight of said composition, said metal protective agent being unreactive with said hydrogen peroxide and said alkali metal hydroxide to thereby protect said metal substrate from attack by said hydrogen peroxide and said alkali metal hydroxide.

7. The method of claim 6, further comprising after said exposing said substrate to said composition, neutralizing residual said alkali metal hydroxide therefor materials on said substrate, rinsing said substrate with water, and drying said substrate.

8. The method of claim 7 wherein said neutralizing comprises exposing said substrate to hot carbonated water.

9. The method of claim 6 further comprising exposing said composition and said flux residue on said substrate to ultraviolet radiation having a wavelength within the range of 184 to 300 nanometers.

10. The method of claim 9 wherein said radiation has a wavelength of about 253 nanometers.

* * * * *